United States Patent [19]

Aguayo

[11] 4,394,532

[45] Jul. 19, 1983

[54] MULTILAYER CURRENT DISTRIBUTION SYSTEMS AND METHODS OF FABRICATION THEREOF

[75] Inventor: Arturo J. Aguayo, Tempe, Ariz.

[73] Assignee: Rogers Corporation, Rogers, Conn.

[21] Appl. No.: 249,393

[22] Filed: Mar. 31, 1981

[51] Int. Cl.³ .............................................. H01B 7/00
[52] U.S. Cl. .................................. 174/72 B; 29/825; 29/860
[58] Field of Search ................ 174/68 B, 70 B, 72 B; 29/825, 854, 855, 856, 860, 25.42; 361/303, 304, 306, 321

[56] References Cited

U.S. PATENT DOCUMENTS 3,310,718 3/1967 Lupfer ............................ 361/321 X
3,778,735 12/1973 Steenmetser .................. 174/72 B X

FOREIGN PATENT DOCUMENTS 1427524 3/1976 United Kingdom .............. 174/72 B

Primary Examiner—Laramie E. Askin
Attorney, Agent, or Firm—David S. Fishman

[57] ABSTRACT

A miniaturized bus bar is presented wherein a plurality of distribution prongs or fingers are mechanically and electrically bonded to a ribbon type capacitor which is defined by a pair of bus conductors and a ceramic spacer.

5 Claims, 2 Drawing Figures

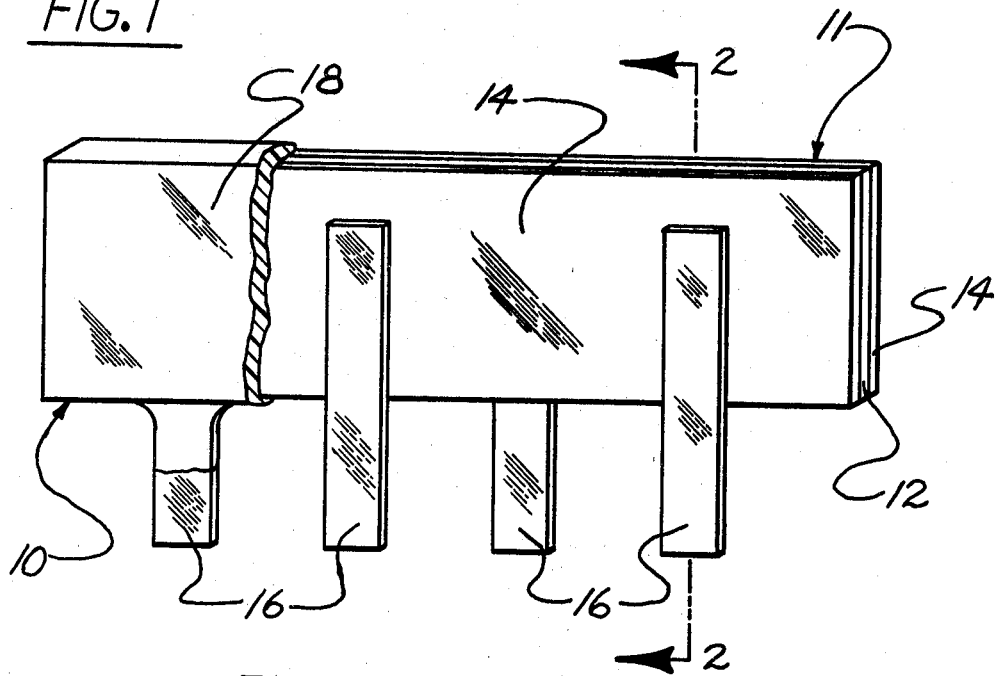
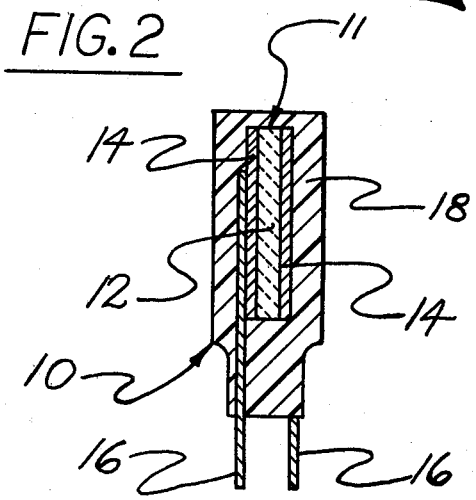

MULTILAYER CURRENT DISTRIBUTION SYSTEMS AND METHODS OF FABRICATION THEREOF

BACKGROUND OF THE INVENTION

1. Field of the Invention

This invention relates to bus bars and especially to relatively small or miniature bus bars. More particularly, this invention relates to multilayer bus bar assemblies, and the method of manufacture thereof, wherein the bus bar assembly incorporates a dielectric material having a high dielectric constant between bus conductors to provide a high capacitance bus bar.

2. Description of the Prior Art

Conventional bus bars of relatively small or miniature size have been known in the art for a number of years. Such bus bar devices are used for power and/or signal distribution in many systems, such as, for example, computer back panels and integrated circuit systems. Such prior art multilayer bus bars comprise at least two conductive plates (usually in the form of elongated strips or bars of copper) separated by an insulating film. A typical prior art bus bar of this type may use copper conductors having a thickness of about 10 mils, and the overall dimensions of the bus bar may be from about 0.019 to 0.120 inch thick, from about 0.150 to 0.200 inch wide and range in length up to about 16 inches. Typically, the separating insulating layer is a plastic dielectric film such as the polyester material known as MYLAR. The MYLAR separator layer and the conductive plates are bonded together by an adhesive. Conventional prior art bus bars of this type have relatively low capacitance which results in the devices being comparatively ineffective in attentuating high frequency noise. This high frequency noise is highly undesirable, especially when the bus bar is used for signal distribution.

One prior art approach to eliminating this noise problem involes connecting capacitors to the bus bar after the completion of the bus bar assembly. While this approach raised the capacitance and minimized the noise, it resulted in additional expense and time in manufacturing.

Another type of bus bar structure known in the prior art includes discrete capacitors disposed between a pair of bus conductors. These bus bars, by virtue of the use of miniaturized capacitors wherein the dielectric has a high dielectric constant have the desired high capacitance. Examples of such high capacitance bus bars are disclosed in U.S. Pat. Nos. 4,236,038 and 4,236,046 and in patent application Ser. No. 950,266, filed Oct. 10, 1978, now U.S. Pat. No. 4,266,091, all of which are owned by the assignee of the present invention. The capacitive elements utilized in the inventions of the above-reference patents and application include thin layers or chips of dielectric material, usually a ceramic with a high dielectric constant. The opposing surfaces of the chips are coated with a thin, integral and continuous film of conductive material and these conductive films are electrically connected to respective ones of the bus conductors.

SUMMARY OF THE INVENTION

The present invention overcomes the above-discussed disadvantages and other deficiencies of the prior art by providing novel and improved structure for and method of assembling a miniaturized bus bar assembly.

In accordance with the present invention a bus bar assembly is constructed by forming an elongated strip from a dielectric material having a high dielectric constant. The opposing surfaces of this strip are coated with a conductive material to form a ribbon capacitor. Bus bar distribution prongs or fingers are then mechanically and electrically bonded to the conductive surfaces of the ribbon capacitor. The whole assembly is subsequently encapsulated within a non-conductive sheath.

Accordingly, the present invention has as one of its numerous objectives the provision of novel miniaturized bus bar assemblies and methods for the fabrication thereof.

BRIEF DESCRIPTION OF THE DRAWINGS

The present invention may be better understood and its numerous objectives and advantages will become apparent to those skilled in the art by reference to the accompanying drawing wherein like reference numerals refer to like elements in the several FIGURES and in which:

FIG. 1 is a perspective view of a portion of a laminated bus bar in accordance with the present invention with the insulating layer partially broken away for clarity of illustration.

FIG. 2 is a sectional view, taken along line 2—2, of the bus bar assembly of FIG. 1.

DESCRIPTION OF THE PREFERRED EMBODIMENT

Referring to FIGS. 1 and 2 jointly, a miniaturized bus bar assembly prepared in accordance with the present invention is indicated generally at 10. Bus bar assembly 10 is formed by mechanically and electrically bonding distribution prongs or fingers 16 to the "plates" of a capacitor ribbon 11. Capacitor ribbon 11 is formed by applying conductive layers 14, such as silver or conductive adhesive, to opposing surfaces of an elongated chip 12. Chip 12 is formed from a ceramic material which has a high dielectric constant, preferably a dielectric constant in excess of 8,000. A ceramic material that may be used in the practice of the present invention is barium titanate. The thickness of chip 12 may range from about 0.005 inch to about 0.015 inch and have opposed face surface dimensions of about 0.2 inch by the length of the bus bar assembly 10. The bus bar distribution prongs or fingers 16 are copper elements, which may be tin plated. These prongs or fingers 16 are approximately 10 mils thick and have dimensions ranging from 0.018 inch by 0.100 inch to 0.032 inch by 0.150 inch. The prongs or fingers 16 are mechanically and electrically bonded to conductive layers 14 by any conventional technique such as soldering or through the use of a conductive adhesive. The final structure then may be encapsulated within insulating sheath 18.

The method of assembly of the structure of the present invention is as follows:

1. Prepare an elongated ceramic member of rectangular cross-section.
2. Form a capacitor ribbon by coating a pair of opposed side surfaces of the ceramic member with conductive material.
3. Electrically bond transversely extending bus bar distribution pins to the conductive coatings of the capacitor ribbon.
4. Encapsulating the assembly within an insulating sheath.

While a preferred embodiment of the present invention has been shown and described, various modifications and substitutions may be made thereto without departing from the spirit and scope of this invention. Accordingly, it will be understood that the present invention has been described by way of illustration and not limitation.

What is claimed is:

1. A multilayer bus bar assembly including:
   capacitor ribbon means, said ribbon means comprising a continuous elongated dielectric member of rectangular cross sections and electrically conductive coatings on a pair of oppositely disposed planar surfaces of the dielectric member; and
   a plurality of distribution prong means on each of said planar surfaces, said prong means being comprised of an electrically conductive material, said prong means being mechanically and electrically bonded to respective coatings of said ribbon means.

2. The bus bar of claim 1 wherein said ribbon means dielectric member is comprised of a ceramic.

3. The bus bar of claim 2 wherein said ribbon means conductive coatings comprise metallized surfaces of the ceramic member.

4. The bus bar of claim 3 further comprising:
   insulating means encapsulating said ribbon means, said prong means extending through said insulating means.

5. A method of forming a bus bar assembly including the following steps:
   forming an elongated flat dielectric ceramic wafer having a rectangular cross-section;
   applying a layer of conductive material to a pair of opposed surfaces of the flat ceramic wafer; and
   electrically and mechanically bonding a plurality of transversely extending conductive distribution prongs to each of the conductive layers on the said opposed surfaces of the flat dielectric ceramic wafer.

* * * * *